(12) United States Patent
Kitamura et al.

(10) Patent No.: US 8,729,642 B2
(45) Date of Patent: May 20, 2014

(54) SEMICONDUCTOR DEVICE COMPRISING A GATE ELECTRODE HAVING AN OPENING

(76) Inventors: Eiji Kitamura, Tokyo (JP); Shinichi Horiba, Tokyo (JP); Nobuyuki Nakamura, Tokyo (JP)

( * ) Notice: Subject to any disclaimer, the term of this patent is extended or adjusted under 35 U.S.C. 154(b) by 400 days.

(21) Appl. No.: 13/252,006

(22) Filed: Oct. 3, 2011

(65) Prior Publication Data

US 2012/0018841 A1    Jan. 26, 2012

Related U.S. Application Data

(63) Continuation of application No. 12/362,498, filed on Jan. 30, 2009, now abandoned.

(30) Foreign Application Priority Data

Jan. 30, 2008 (JP) ................................. 2008-019163
Dec. 11, 2008 (JP) ................................. 2008-315572

(51) Int. Cl.
*H01L 27/088* (2006.01)
*H01L 23/52* (2006.01)

(52) U.S. Cl.
USPC .......................................... 257/401; 257/530

(58) Field of Classification Search
CPC . H01L 23/5252; H01L 23/525; H01L 23/522; H01L 27/11206
USPC ........................................... 257/401, 529, 530
See application file for complete search history.

(56) References Cited

U.S. PATENT DOCUMENTS

| | | | |
|---|---|---|---|
| 6,515,344 | B1 | 2/2003 | Wollesen |
| 7,256,471 | B2 | 8/2007 | Min et al. |
| 7,755,162 | B2 | 7/2010 | Kurjanowicz et al. |
| 7,872,897 | B2 * | 1/2011 | Tonti et al. ................ 365/96 |
| 2006/0226509 | A1 | 10/2006 | Min et al. |
| 2007/0120221 | A1 * | 5/2007 | Fifield et al. ............... 257/530 |
| 2009/0224325 | A1 | 9/2009 | Min et al. |
| 2010/0261324 | A1 * | 10/2010 | Ogura et al. ............... 438/257 |
| 2011/0122672 | A1 | 5/2011 | Kodama et al. |
| 2011/0312169 | A1 * | 12/2011 | Kurjanowicz et al. ....... 438/585 |

FOREIGN PATENT DOCUMENTS

| | | |
|---|---|---|
| JP | 2001-102456 | 4/2001 |
| JP | 2002-319674 | 10/2002 |
| JP | 2007-194486 | 8/2007 |

* cited by examiner

*Primary Examiner* — Ngan Ngo
(74) *Attorney, Agent, or Firm* — Young & Thompson

(57) ABSTRACT

A semiconductor device comprises an active region formed in a semiconductor substrate and a gate electrode formed on the active region via a gate insulating film formed on a surface of the active region. A peripheral portion of the gate electrode and a peripheral portion of the active region overlap each other at a position where the active region is not divided by the gate electrode when viewed in plan view, thus forming an overlap region.

20 Claims, 9 Drawing Sheets

SEMICONDUCTOR DEVICE COMPRISING A GATE ELECTRODE HAVING AN OPENING

CROSS REFERENCE TO RELATED APPLICATIONS

This application is a continuation of co-pending application Ser. No. 12/362,498 filed on Jan. 30, 2009, which claims foreign priority to Japanese patent application Nos. 2008-019163 and 2008-315572 filed on Jan. 30, 2008 and Dec. 11, 2008, respectively. The entire content of each of these applications is hereby expressly incorporated by reference.

BACKGROUND OF THE INVENTION

1. Field of the Invention

The present invention relates to a semiconductor device used as an anti-fuse element and a method of manufacturing the semiconductor device.

2. Description of the Related Art

An anti-fuse element is normally electrically insulated but is electrically conductive when a voltage is applied to the element. The anti-fuse element is used in order to replace a defective portion of a semiconductor integrated circuit with a redundancy circuit.

FIG. 1A shows a sectional view of an anti-fuse element according to the related art in which a gate insulating film functions as an anti-fuse. FIG. 1B is a plan view of the anti-fuse element in FIG. 1A, showing only some components of the anti-fuse element for easy understanding of the configuration of the element.

As seen in FIG. 1A, the anti-fuse element according to the related art has a configuration that is the same as the layout of a common MOS (Metal Oxide Semiconductor) transistor. Active region 102 surrounded by isolation region 106 is provided on semiconductor substrate 110. Gate electrode 101 is provided on active region 102 via gate insulating film 104. As seen in FIG. 1B, gate electrode 101 is located to cross active region 102 so as to divide active region 102. Diffusion layer 105, which is formed by the introduction of impurities that have the opposite conductivity type into semiconductor substrate 110, is formed on opposite sides of active region 102 divided by gate electrode 103. Gate electrode 101 and diffusion layer 105 are connected to wiring layer 109 through contact plugs 108 formed in interlayer dielectric 107. For the purpose of description, contact plug 108 connected to gate electrode 101 and located on isolation region 106 in FIG. 1B is illustrated, in FIG. 1A, on the same cross section on which contact plugs 108 connected to diffusion layer 105 are present.

To allow proper operation of those of anti-fuse elements initially insulated by gate insulating film 104 which are to be connected, a high electric field is applied between gate electrode 101 and diffusion layer 105 to destroy gate insulating film 104, causing short-circuiting. Thus, gate electrode 101 can be connected to diffusion layer 105. This connection operation allows a high current to flow through the destroyed part of gate insulating film 104 to provide energy, resulting in ohmic contact.

In recent years, the gate insulating film has been thinned in connection with miniaturizing circuits to increase gate leakage current flowing between the gate electrode and the active region via the gate insulating film. In the anti-fuse element according to the related art described above, the increased gate leakage current may disperse the high current (energy) to areas other than the destroyed one when a high electric field is applied between the gate electrode and the diffusion layer. Thus, it may not be possible to obtain acceptable ohmic contact even after the dielectric has been destroyed, causing some elements to offer high resistance. To prevent this, a signal amplification circuit dedicated to the anti-fuse element is added or the circuit is changed such that anti-fuses are arranged in parallel to allow a logical OR operation to be performed. Then, even with the element offering high resistance, the circuit is prevented from operating inappropriately. However, this measure hinders a reduction in the size of chip area and also complicates circuit design and increases the number of steps required; thus this measure is not preferable.

SUMMARY OF THE INVENTION

In one embodiment, there is provided a semiconductor device that comprises an active region formed in a semiconductor substrate and a gate electrode formed on the active region via a gate insulating film formed on a surface of the active region. A peripheral portion of the gate electrode and a peripheral portion of the active region overlap each other at a position where the active region is not divided by the gate electrode when viewed in plan view, thus forming an overlap region.

In this semiconductor device, the overlap region, in which the active region overlaps the gate electrode is made smaller to enable a reduction in gate leakage current and in the area that is to be destroyed. Thus, even with the thinned gate insulating film, current that flows when the gate insulating film is destroyed is inhibited from dispersing. This allows an ohmic connection to be easily made. Furthermore, the overlap region can be made smaller without the need for miniaturization based on processing. This eliminates the need to increase the number of steps required. Thus, a semiconductor device serving as a more reliable anti-fuse element can be implemented without the need to provide an additional circuit or to change a related process.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Figure 2A:
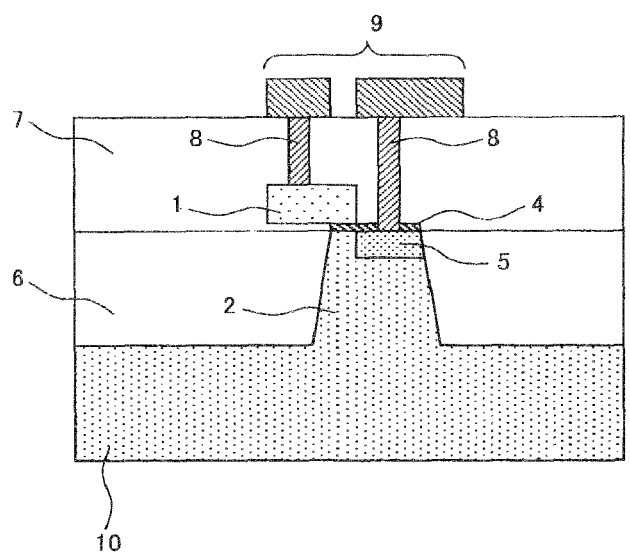
FIG. 2A is a schematic sectional view of a semiconductor device according to a first embodiment of the present invention.
Figure 2B:
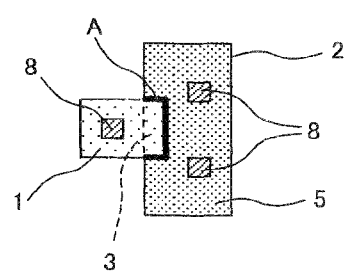
FIG. 2B is a schematic plan view of the semiconductor device according to the first embodiment of the present invention.

FIGS. 2A and 2B are a sectional view and a plan view of a semiconductor device according to a first embodiment of the present invention. The plan view in FIG. 2B shows only some components in order to allow the configuration of the device to be easily understood.

Referring to FIGS. 2A and 2B, the semiconductor device according to the first embodiment of the present invention includes active region 2 provided on semiconductor substrate 10 and surrounded by isolation region 6, and gate insulating film 4 located on a surface of active region 2. Gate electrode 1 is provided on active region 2 via gate insulating film 4. Diffusion layer 5 into which impurities of a conductivity type that is different from that of semiconductor substrate 10 are doped is formed in active region 2 so as to be self-aligned with gate electrode 1. Gate electrode 1 and diffusion layer 5 are connected to upper wiring layer 9 through contact plugs 8 formed in interlayer dielectric 7. Here, a major characteristic of the layout of the semiconductor device according to the present embodiment is seen in FIG. 2B, gate electrode 1 is biased toward one side of active region 2 so that a peripheral portion of gate electrode 1 overlaps a peripheral portion of active region 2. Another major characteristic is that gate electrode 1 and active region 2 do not cross each other so that an end of gate electrode 1 is positioned inside active region 2.

Gate leakage current, which is a factor reducing the reliability of the anti-fuse element, is known to be generally in proportion to gate capacity, that is, the area of overlap region 3, which is an effective gate area. According to the related art, in patterning of gate electrode 101 and active region 102 in a semiconductor device which has the same layout as that of a common MOS transistor, the area of overlap region 103 cannot be made smaller than that achieved when gate electrode 101 and active region 102 are formed so as to have minimum processing dimensions determined based on the resolution limit of lithography. However, in the semiconductor device according to the present embodiment, by positioning gate electrode 1 so as to prevent active region 2 from being divided into at least two independent regions (diffusion layers), overlap region 3, formed by gate electrode 1 and active region 2, can be made much smaller than the overlap region in the semiconductor device according to the related art. Thus, even with thinned gate insulating film 4, the gate leakage current can be significantly reduced, enabling the reliability of the anti-fuse element to be improved.

Figure 1A:
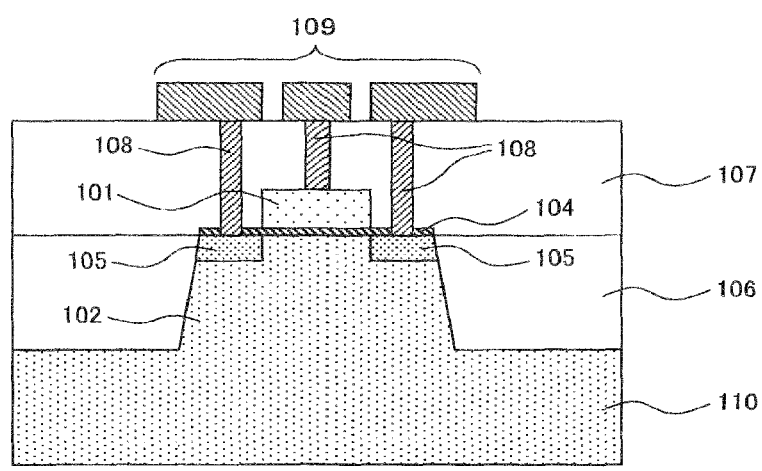
FIG. 1A is a schematic sectional view according to the related art of a semiconductor device which is used as an anti-fuse element.
Figure 1B:
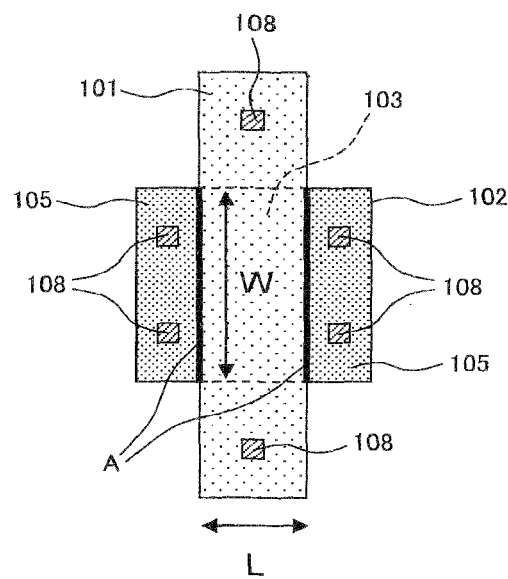
FIG. 1B is a schematic plan view according to the related art of the semiconductor device which is used as an anti-fuse element.

Furthermore, gate electrode 1 and active region 2 are arranged so that the peripheral portion of gate electrode 1 overlaps the peripheral portion of active region 2. Thus, only one diffusion layer 5 is constructed. Consequently, pattern edge A corresponding to an edge portion between a planar pattern of overlap region 3 and a planar pattern of diffusion layer 5, shown by a thick line in FIG. 2B, can be easily made shorter than the total length of the thick lines, shown in FIG. 1B, in the semiconductor device according to the related art. At pattern edge A, a decrease in breakdown voltage and an increase in gate leakage current are likely to be caused by, for example, possible processing damage during the step of forming gate electrode 1, described below. Thus, shortened pattern edge A inhibits possible dispersion at a position where dielectric breakdown is likely to occur. This more effectively improves the reliability of the anti-fuse element.

In the layout of the related art, the total length of pattern edge A is minimized if active region 2 is formed with minimum processing dimensions defined by the resolution limit of lithography. However, a layout such as that of the semiconductor device according to the present embodiment allows pattern edge A to be easily shortened. Furthermore, the length of pattern edge A can be made further smaller than a value twice the minimum processing dimension in active region 2, which corresponds to the minimum length in the layout of the related art.

As described above, overlap region 3 and pattern edge A in the semiconductor device according to the present embodiment can be made smaller than the overlap region and pattern edge in the semiconductor device according to the related art without the need for miniaturization based on processing. Thus, possible gate leakage current and the area to be destroyed can be reduced. Consequently, even with thinned gate insulating film 4, current that flows when gate insulating film 4 is destroyed is inhibited from being dispersed. This allows an ohmic connection to be easily made. Therefore, a semiconductor device as a more reliable anti-fuse element can be implemented.

Now, with reference to FIGS. 3 to 7, a method of manufacturing a semiconductor device according to the first embodiment will be described.

The method of manufacturing the semiconductor device of the present embodiment includes forming the active region on the semiconductor substrate, and forming the gate electrode on the active region via the gate insulating film. The formation of the gate electrode includes forming the gate insulating film on the surface of the active region, and forming the gate electrode on the gate insulating film so that the peripheral portion of the gate electrode overlaps the peripheral portion of the active region at the position where the active region is not divided by the gate electrode, so as to form the overlap region.

Figure 3:
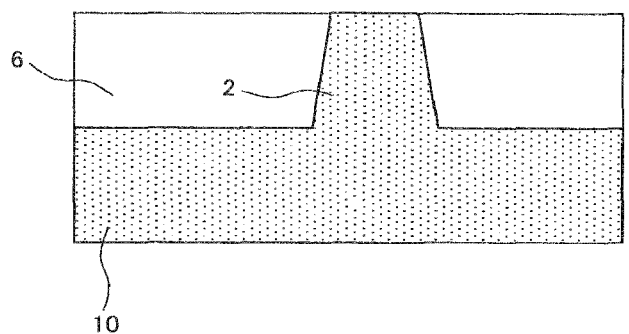
FIGS. 3 to 7 are step diagrams illustrating a method of manufacturing a semiconductor device according to the first embodiment of the present invention.

First, as shown in FIG. 3, an isolation method such as an STI (Shallow Trench Isolation) technique is used to form isolation region 6 that divides semiconductor substrate 10 made up of silicon so as to form active region 2. Although not shown in the drawings, a desired well and a channel region of a MOS transistor are formed in active region 2 using lithography, ion implantation, an annealing technique, or the like. In an ion implantation operation, phosphorous, arsenic, antimony, or the like is implanted to form an N-type region.

Boron, boron fluoride, gallium, indium, or the like is implanted to form a P-type region.

Figure 4:
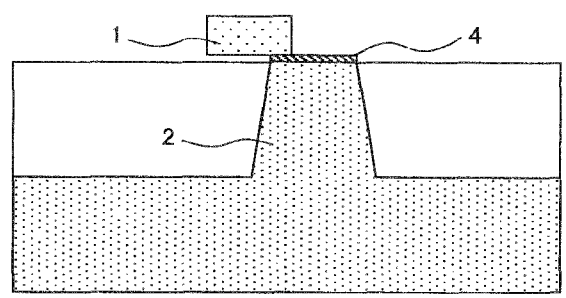

Now, with reference to FIG. 4, the step of forming gate insulating film 4 and gate electrode 1 will be described. First, gate insulating film 4 is formed on active region 2 using a technique such as thermal oxidation. Gate insulating film 4 may be a silicon oxide film, a silicon nitride film, a silicon oxynitride film, a hafnium-based dielectric film such as a hafnium oxide film or a hafnium oxynitride film, an alumina-based dielectric film such as an aluminum oxide film or an aluminum oxynitride film, or a dysprosium-based dielectric film such as dysprosium oxide. Moreover, a gate electrode layer is deposited on gate insulating film 4 using a technique such as CVD (Chemical Vapor Deposition). Examples of the gate electrode layer include a polysilicon film, a tungsten film, a tungsten silicide film, a titanium film, a titanium silicide film, a cobalt film, a cobalt silicide film, a tantalum film, a tantalum carbide film formed using CVD, sputtering or the like, and a laminate structure of any of these films. The gate electrode layer is processed using lithography, an etching technique, or the like to form a pattern of gate electrode 1. The lithography for patterning gate electrode 1 is carried out using a photo mask (reticle) which is constructed such that an end of gate electrode 1 overlaps an end of active region 2 in the element region that functions as an anti-fuse, and such that overlap region 3 and the pattern edge length are made smaller than the overlap region and pattern edge length which can be achieved by the layout of the related art.

Figure 5:
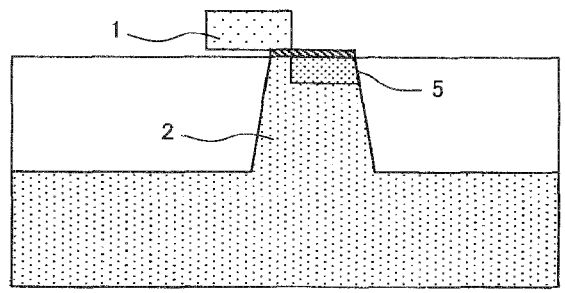

Subsequently, as shown in FIG. 5, lithography, ion implantation, annealing, etching, CVD, an epitaxial technique, or the like is used to form diffusion layer 5 such as an LDD (Lightly Doped Drain) region or a source/drain region. Diffusion layer 5 is formed in active region 2 in a self-aligned manner through gate electrode 1 as a mask. In the element region that functions as an anti-fuse, gate electrode 1 and active region 2 are arranged so that the end of gate electrode 1 overlaps the end of active region 2. Thus, only one diffusion layer 5 is formed unlike in the case of the anti-fuse element of the related art which has the same layout as that of a common MOS transistor. Phosphorous, arsenic, antimony, or the like can be implanted to form an N-type diffusion layer. Boron, boron fluoride, gallium, indium, or the like can be implanted to form a P-type diffusion layer.

Figure 6:
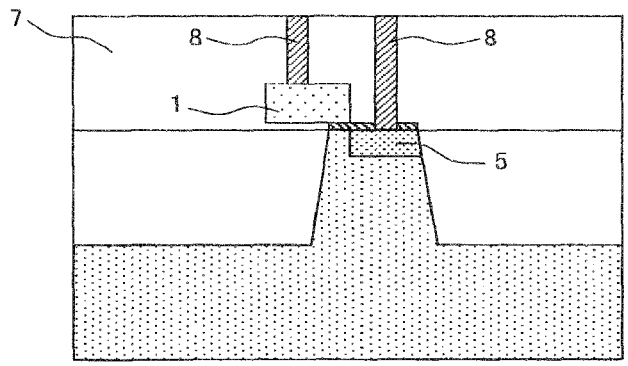

FIG. 6 is a diagram illustrating the step of forming contact plugs 8. Interlayer dielectric 7 is deposited using a CVD method or the like. Thereafter, the lithography, the etching technique, or the like is used to form contact holes for diffusion layer 5 and gate electrode 1. Conductive materials are then buried in the contact holes by a CVD or CMP (Chemical Mechanical Polishing) method to form contact plugs 8.

Figure 7:
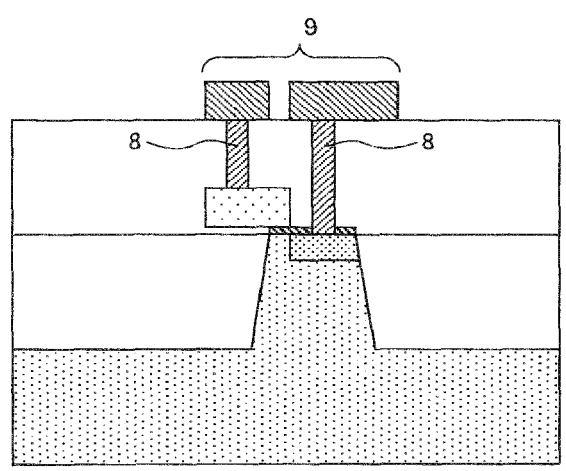

Finally, as shown in FIG. 7, a wiring material is deposited by a sputtering method or the like and formed into desired wiring layer 9 for respective contact plugs 8 using CVD, lithography, etching technique, or the like.

As described above, like the anti-fuse element of the related art, the semiconductor device, according to the present embodiment, which is used as an anti-fuse element has the same film structure as that of transistors typically used in circuits. Thus, the semiconductor device, according to the present embodiment, which is used as an anti-fuse element has the great advantage of enabling the anti-fuse characteristic to be improved without the need to change a related process or to increase the number of steps required.

Other embodiments of the semiconductor device according to the present invention will be described with reference to FIGS. 8 to 10.

Figure 8A:
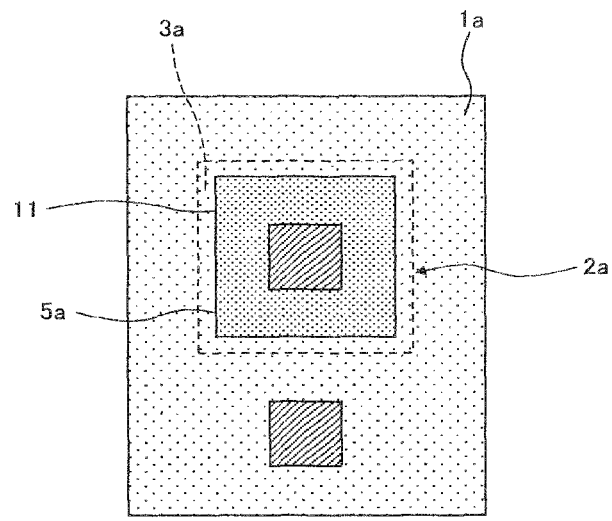
FIG. 8A is a schematic plan view of the semiconductor device according to a second embodiment of the present invention.

In the semiconductor device according to a second embodiment shown in FIG. 8A, on rectangular active region 2a, gate electrode 1a with opening 11 smaller than active region 2a is provided. Active region 2a and gate electrode 1a are arranged so that a peripheral portion of active region 2a overlaps an opening edge of gate electrode 1a. Thus, overlap region 3a is formed to surround diffusion layer 5a along all sides of the peripheral portion of active region 2a. Of course, gate electrode 1a is more effectively positioned so that overlap region 3a is formed by three sides, two sides, or one side of the peripheral portion of active region 2a.

Figure 8B:
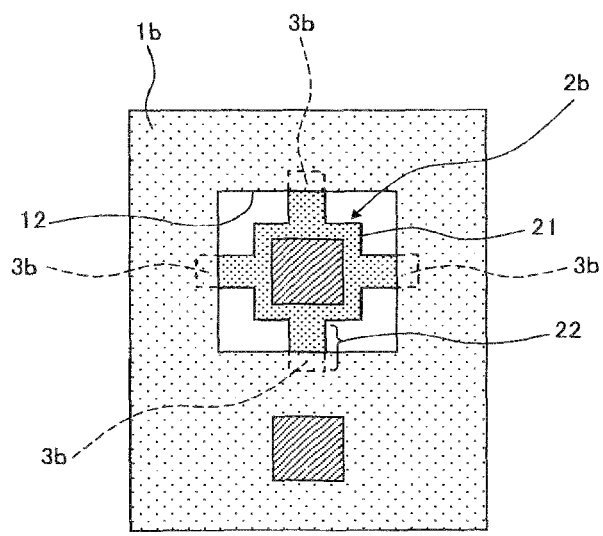
FIG. 8B is a schematic plan view of the semiconductor device according to a third embodiment of the present invention.

Furthermore, as shown in FIG. 8B, in the semiconductor device according to a third embodiment of the present invention, the area of overlap region 3b can further be reduced by shaping active region 2b in the form of a cross. Here, overlap region 3b is positioned at each of four tip portions of active region 2b. Also in this case, overlap region 3b may be located at three, two, or one of the four tip portions. The shape of active region 2b is not limited to the cross but may be formed of central rectangular portion 21 and extension portions 22 extending from central rectangular portion 21.

Figure 9A:
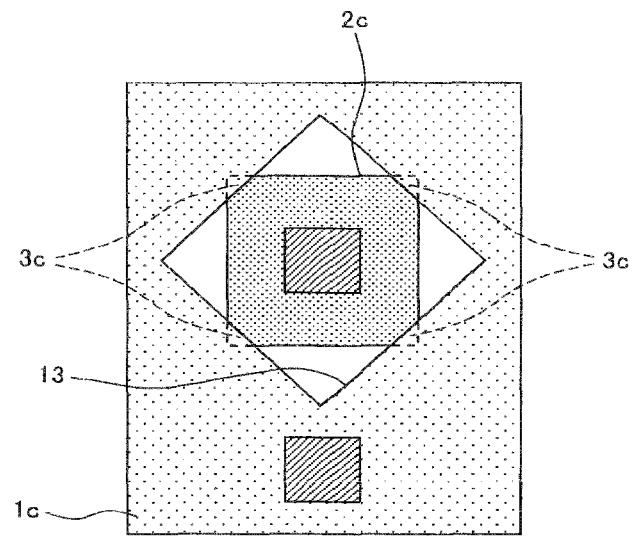
FIG. 9A is a schematic plan view of the semiconductor device according to a fourth embodiment of the present invention.
Figure 9B:
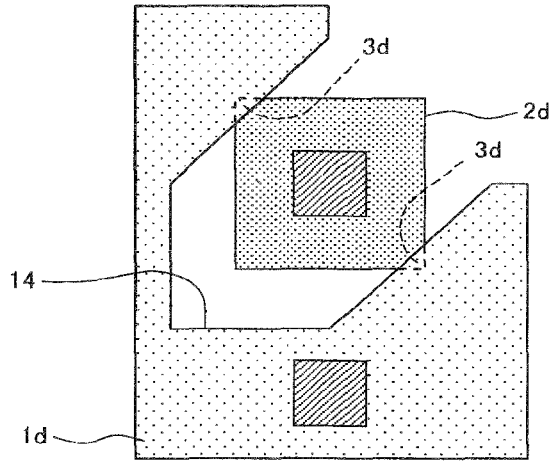
FIG. 9B is a schematic plan view of the semiconductor device according to a fifth embodiment of the present invention.

In a semiconductor device according to a fourth embodiment of the present invention shown in FIG. 9A, rectangular opening 13 is formed in gate electrode 1c as is the case with the second and third embodiments. However, overlap region 3c of the semiconductor device according to the present embodiment is formed of each of four corners of rectangular active region 2c and a corresponding one of four sides of opening edge of gate electrode 1c. Also in this case, overlap region 3c may be located at three, two, or one of the four corners. Furthermore, a semiconductor device according to a fifth embodiment of the present invention shown in FIG. 9B is a variation of the fourth embodiment of the present invention. This semiconductor device is configured such that a part of opening 13 formed in gate electrode 1c in FIG. 9A is removed to form cut portion 14 in gate electrode 1d. Overlap region 3d is formed between each of two corners of rectangular active region 2d and a corresponding one of two sides connecting to the cut edge of gate electrode 1d.

Figure 10A:
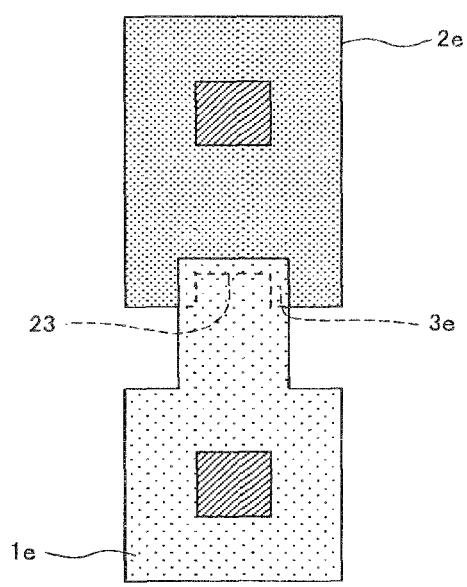
FIG. 10A is a schematic plan view of the semiconductor device according to a sixth embodiment of the present invention.
Figure 10B:
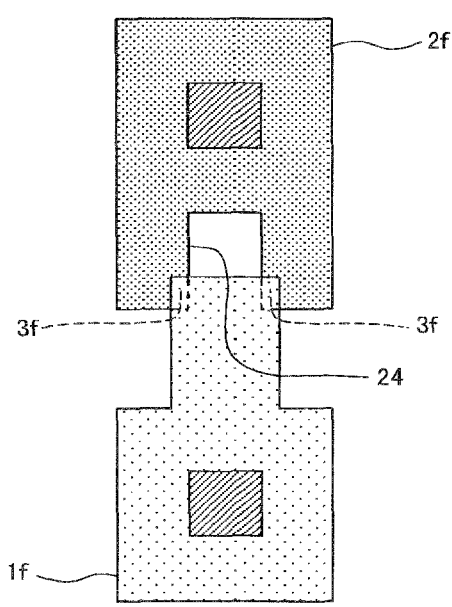
FIG. 10B is a schematic plan view of the semiconductor device according to a seventh embodiment of the present invention.

Referring to FIG. 10A, a semiconductor device according to a sixth embodiment of the present invention is laid out such that recessed notch portion 23 is formed in any one side of active region 2e, with overlap region 3e formed along three sides making up notch portion 23. The semiconductor device may alternatively be laid out such that gate electrode 1e may be moved either rightward or leftward so as to form overlap region 3e along two of three sides making up notch portion 23. Furthermore, in a semiconductor device according to a seventh embodiment of the present invention shown in FIG. 10B, active region 2f includes notch portion 24 formed deeper than notch portion 23 according to the sixth embodiment. Overlap region 3f is formed at two tip portions on the periphery of notch portion 24. Also in this case, overlap region 3f can be located at a single position by moving gate electrode 1f either rightward or leftward.

In each of the above-described configuration examples, instead of the layout as in the related art wherein the plain pattern of the gate electrode is positioned so as to divide the plain pattern of the active region, the device is laid out such that the peripheral portion of each of gate electrodes 1a to 1f overlaps the peripheral portion of the corresponding active regions 2a to 2f. Thus, also in this case, each of overlap regions 3a to 3f and pattern edge A can be made smaller than the overlap regions and pattern edge according to the related art. This enables a reduction in possible gate leakage current and the area to be destroyed. Consequently, possible dispersion of current to areas other than the destroyed area is inhibited, allowing the breakage to concentrate at one point. This allows an ohmic connection to be easily made, enabling the anti-fuse characteristic to be improved.

Each of the above-described configuration examples, that is, the layout including overlap region 3a to 3f at least two positions, also has the advantage of providing an element that allows a large overlap margin to be provided between patterns during manufacture, and that allows a reliable contact to be made at any position even if overlapping misalignment occurs between the patterns.

With patterns that have a minimum lithography processing dimension of at most 0.2 μm, when a rectangular pattern or a rectangular hole pattern on the photo mask (reticle) is transferred to and formed on the resist on the semiconductor substrate, rectangular corners may be rounded owing to optical characteristics. The gate electrode pattern may be laid out with such a variation taken into account in advance.

As further embodiments of the semiconductor device according to the present invention, a more effective layout will described with reference to FIGS. 11 to 14.

Figure 11:
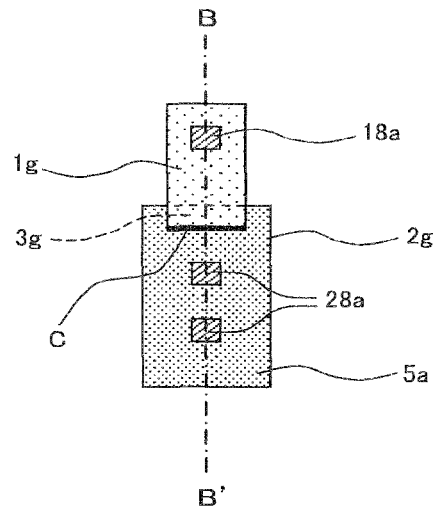
FIG. 11 is a schematic plan view of the semiconductor device according to a eighth embodiment of the present invention.
Figure 12:
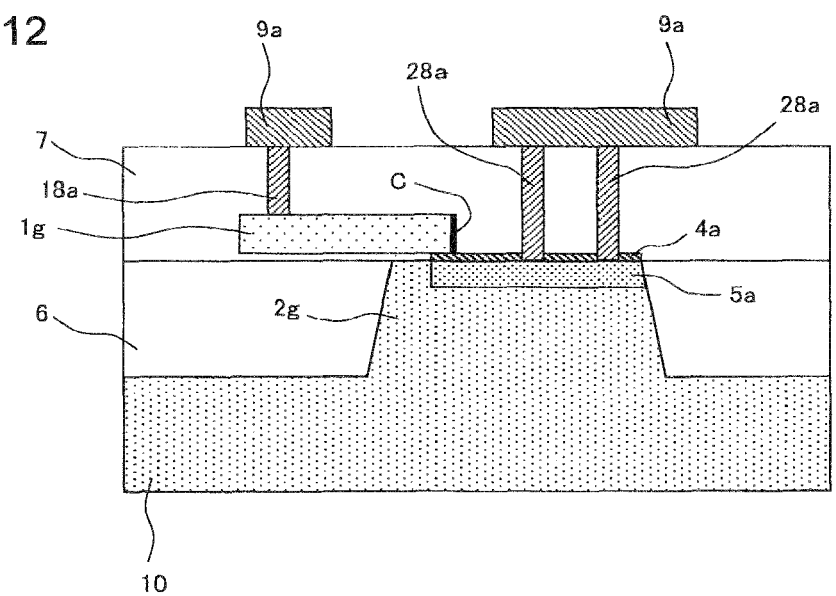
FIG. 12 is a schematic sectional view of the semiconductor device taken along line B-B' in FIG. 11.

A semiconductor device according to an eighth embodiment of the present invention shown in a plan view in FIG. 11 is configured such that the location of the gate electrode of the first embodiment shown in FIG. 2B is changed. FIG. 12 is a sectional view of the semiconductor device according to the eighth embodiment taken along line B-B' in FIG. 1.

In the present embodiment, in FIG. 11, gate electrode 1g is formed to extend along line B-B' joining contact plug 18a to two contact plugs 28a, wherein contact plug 18a is connected to gate electrode 1g and two contact plugs 28a are connected to active region 2g. Thus, overlap region 3g formed between gate electrode 1g and active region 2g is positioned on the straight line joining contact plug 18a to contact plugs 28a, and is also positioned between contact plug 18a and both contact plugs 28a.

Since overlap region 3g and contact plugs 18a and 28a are thus arranged, when gate insulating film 4a is destroyed to make the anti-fuse element electrically conductive, the electric field applied between gate electrode 1g and active region 2g (diffusion layer 5a) can be made to concentrate in an area at the end of gate electrode 1g. Thus, dielectric breakdown in overlap region 3g can be allowed to occur in the vicinity of an area shown by thick line C in FIG. 11. As shown in FIG. 12, impurity diffusion layer 5a (FIG. 12) formed in active region 2g is located below the end of gate electrode 1g shown by thick line C. Thus, the end of a current path formed by the dielectric breakdown reaches diffusion layer 5a, thus maintaining a small electric resistance value. Therefore, with the configuration in which contact plugs 18a and 28a and overlap region 3g are arranged on the same straight line as shown in FIG. 11, dispersion of the area in which the dielectric breakdown is likely to occur can be inhibited. When a large number of anti-fuse elements are provided, the present embodiment can make the resistance value more stable than the embodiment shown in FIGS. 2A and 2B.

Figure 13:
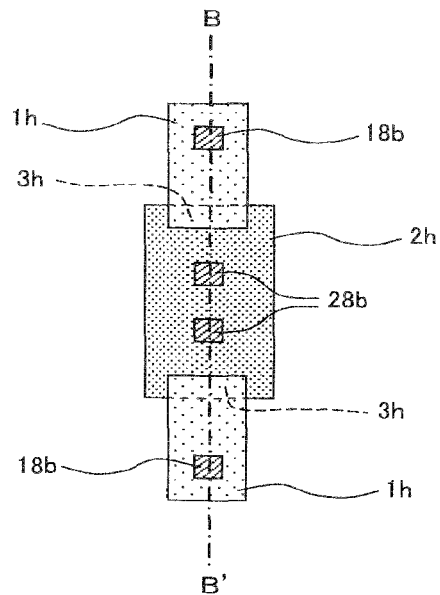
FIG. 13 is a schematic plan view of the semiconductor device according to a ninth embodiment of the present invention.

Alternatively, as shown in FIG. 13, a semiconductor device according to a ninth embodiment of the present invention corresponds to the configuration shown in FIG. 11 and in which another gate electrode 1h is formed at each of the opposite ends of rectangular active region 2h. In this case, two gate electrodes 1h are formed so as to extend along line B-B' joining contact plug 18b that is connected to each gate electrode 1h to contact plug 28h on active region 2h as viewed from a direction orthogonal to the semiconductor substrate. Thus, two overlap regions 3h formed between active region 2h and respective gate electrodes 1h are both located on line B-B'. Each overlap region 3h is positioned between contact plug 28b and one corresponding contact plug of contact plugs 18b that are connected to respective gate electrodes 1h, wherein contact plug 28b is connected to active region 2h and contact plugs 18b are connected to respective gate electrodes 1h. This arrangement enables a possible variation in resistance value to be inhibited while the anti-fuse element is electrically conductive. In addition, according to the present embodiment, two overlap regions, that is, two anti-fuse element regions, can be arranged in one active region. Thus, compared to the eighth embodiment, the present embodiment enables a reduction in the size of the area required to lay out one anti-fuse element, thus contributing to miniaturization of the circuit.

Figure 14:
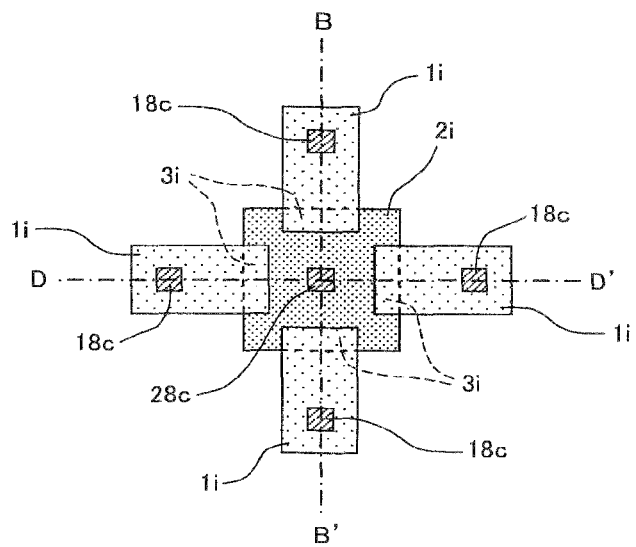
FIG. 14 is a schematic plan view of the semiconductor device according to a tenth embodiment of the present invention.

As shown in FIG. 14, in a semiconductor device according to a tenth embodiment of the present invention, gate electrode 1i is located on each of four sides of rectangular active region 2i. Each overlap region 3i thus formed can be located on a straight line (line B-B' or D-D') joining contact plug 28c to one corresponding contact plug of contact plugs 18c, wherein contact plug 28c is connected to active region 2i and contact plugs 18c are connected to respective gate electrodes 1i.

As described above, the present invention allows easy manufacture of a semiconductor device which improves reliability and allows a possible variation in electric resistance value to be inhibited while the anti-fuse element is electrically conductive.

It is apparent that the present invention is not limited to the above embodiments, but may be modified and changed without departing from the scope and spirit of the invention.

What is claimed is:

1. A semiconductor device comprising:
an active region formed in a semiconductor substrate, the active region defined by an isolation region;
an insulating film formed on the active region;
a gate electrode formed on the insulating film, the gate electrode having an opening, the active region and the isolation region being disposed in the opening; and
an overlap portion formed by a gate electrode portion having an opening edge and a portion of the active region.

2. The semiconductor device according to claim 1, wherein the active region includes a rectangular portion as viewed in plan view.

3. The semiconductor device according to claim 2, wherein the portion of the active region is a corner of the rectangular portion.

4. The semiconductor device according to claim 2, wherein the active region further includes an extension portion extending from the rectangular portion and the overlap portion is formed at the extension portion of the active region.

5. The semiconductor device according to claim 2, wherein a part of the opening is removed to form a cut portion.

6. The semiconductor device according to claim 5, wherein the portion of the active region is a corner of the rectangular portion.

7. The semiconductor device according to claim 1, wherein the gate electrode and the active region operates as an anti-fuse element.

8. The semiconductor device according to claim 7, wherein the anti-fuse element flows an electric current by destroying the insulating film at the overlap portion.

9. The semiconductor device according to claim 1, further comprising a first contact plug connected to the gate electrode and the second contact plug connected to the active region.

10. A semiconductor device comprising:
a semiconductor substrate; and
an anti-fuse element disposed on the semiconductor substrate, the anti-fuse element comprising:

an active region formed in the semiconductor substrate, the active region defined by an isolation region;

an insulating film formed on the active region;

a gate electrode formed on the insulating film, the gate electrode having an opening, the active region and the isolation region being disposed in the opening; and an overlap portion formed by a gate electrode portion having an opening edge and a portion of the active region.

11. The semiconductor device according to claim 10, wherein the active region includes a rectangular portion as viewed in plan view.

12. The semiconductor device according to claim 11, wherein the portion of the active region is a corner of the rectangular portion.

13. The semiconductor device according to claim 11, wherein the active region further includes an extension portion extending from the rectangular portion and the overlap portion is formed at the extension portion of the active region.

14. The semiconductor device according to claim 11, wherein a part of the opening is removed to form a cut portion.

15. A semiconductor device including an anti-fuse element, the anti-fuse element comprising:

a semiconductor substrate;

an element isolation region formed on the semiconductor substrate;

an active region formed on the semiconductor substrate and surrounded by the element isolation region; and a gate electrode formed over the semiconductor substrate, the gate electrode including an opening exposing a center portion of the active region and the element isolation region, the gate electrode being overlapped with a peripheral portion of the active region.

16. The semiconductor device as claimed in claim 15, wherein the center portion includes a rectangular portion; and wherein the peripheral portion includes an extension portion extending from a side of the rectangular portion.

17. The semiconductor device as clamed in claim 15, wherein the center portion includes a rectangular portion having first to fourth edges;

wherein the peripheral portion includes first, second, third and fourth extension portions extending from a corresponding one of the first to fourth edges of the rectangular portion;

wherein the opening includes a rectangular opening having first to fourth sides;

wherein the gate electrode includes first, second, third and fourth overlapping portions, the first overlapping portion overlapping the first extension portion across the first side, the second overlapping portion overlapping the second extension portion across the second side, the third overlapping portion overlapping the third extension portion across the third side, and the fourth overlapping portion overlapping the fourth extension portion across the fourth side; and wherein the element isolation region exposed by the opening includes first to fourth isolation portions, the first isolation portion being defined by the first and second extension portions and the first and second sides, the second isolation portion being defined by the second and third extension portions and the second and third sides, the third isolation portion being defined by the third and fourth extension portions and the third and fourth sides, and the fourth isolation portion being defined by the fourth and first extension portions and the fourth and first sides.

18. The semiconductor device as claimed in claim 15, wherein the center portion includes a rectangular portion defined by first to fourth edges;

wherein the peripheral portion includes first, second, third and fourth corner portions of the rectangular portion, the first corner portion being defined by the first and second edges, the second corner portion being defined by the second and third edges, the third corner portion being defined by the third and fourth edges, and the fourth corner portion being defined by the fourth and first edges;

wherein the opening includes a rectangular opening having first to fourth sides;

wherein the gate electrode includes first, second, third and fourth overlapping portions, the first overlapping portion overlapping the first corner portion, the second overlapping portion overlapping the second corner portion, the third overlapping portion overlapping the third corner portion, and the fourth overlapping portion overlapping the fourth corner portion; and wherein the element isolation portion defined by the opening includes first to fourth isolation portions, the first isolation portion being defined by the first and fourth sides and the first edge, the second isolation portion being defined by the first and second sides and the second edge, the third isolation portion being defined by the second and third sides and the third edge, and the fourth isolation portion being defined by the third and fourth sides and the fourth edge.

19. The semiconductor device as claimed in claim 15, wherein the center portion includes a rectangular portion defined by first to fourth edges;

wherein the peripheral portion includes first, second, third and fourth corner portions of the rectangular portion, the first corner portion being defined by the first and second edges, the second corner portion being defined by the second and third edges, the third corner portion being defined by the third and fourth edges, and the fourth corner portion being defined by the fourth and first edges, the second corner portion being exposed by the opening;

wherein the gate electrode includes first and second overlapping portions, the first overlapping portion overlapping the first corner portion, and the second overlapping portion overlapping the third corner portion; and wherein the element isolation portion exposed by the opening is defined by the second and third edges.

20. The semiconductor device as claimed in claim 15, wherein the gate electrode is divided around the fourth corner portion such that the fourth corner portion is exposed by the opening.

* * * * *